(12) United States Patent
Tada

(10) Patent No.: US 6,646,905 B2
(45) Date of Patent: Nov. 11, 2003

(54) FERROELECTRIC STORAGE DEVICE

(75) Inventor: Yoshihiro Tada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/042,659

(22) Filed: Jan. 8, 2002

(65) Prior Publication Data

US 2002/0093847 A1 Jul. 18, 2002

(30) Foreign Application Priority Data

Jan. 18, 2001 (JP) .......................................... 2001-009852

(51) Int. Cl.[7] .............................................. G11C 11/22
(52) U.S. Cl. ........................ 365/145; 365/149; 365/201; 365/210
(58) Field of Search ................................. 365/145, 149, 365/201, 210

(56) References Cited

U.S. PATENT DOCUMENTS 5,991,189 A * 11/1999 Miwa .......................... 365/145
6,046,926 A * 4/2000 Tanaka et al. ............... 365/145
6,335,876 B1 * 1/2002 Shuto .......................... 365/145

* cited by examiner

Primary Examiner—Son T. Dinh
(74) Attorney, Agent, or Firm—Hogan & Hartson

(57) ABSTRACT

A ferroelectric storage device having 2Tr-2C cell structure or 1Tr-1C cell structure, which can be assessed by a screening test. In the test, a regulated reference voltage is supplied from an external reference voltage input terminal to one end of a sense amplifier. The bit line voltage of the memory cell is input to the other terminal of the sense amplifier. Characteristics of the ferroelectric capacitor are determined quantitatively by measuring the bit line voltages by changing the reference voltage. Deviations in characteristics and degrees of defect/degradation of ferroelectric capacitors can be assessed by such measurement to improve the reliability of the ferroelectric storage device.

5 Claims, 8 Drawing Sheets

FERROELECTRIC STORAGE DEVICE

FIELD OF THE INVENTION

The invention relates to a storage device having an array of ferroelectric memory cells each containing information storing ferroelectric capacitors having a ferroelectric film as an insulator.

BACKGROUND OF THE INVENTION

Ferroelectric materials have a characteristic that, once an electric polarization is created by an applied electric field, it remains even after the electric field is removed. Therefore, the polarization in a ferroelectric material will not be erased unless an opposite electric field of a certain intensity is applied to the material. Hence, it exhibits a hysteresis characteristic.

A ferroelectric memory, which utilizes ferroelectric capacitors for storing information and contains a ferroelectric film as an insulator, is a fast rewritable non-volatile memory, taking advantage of the ferroelectric property that it has a prolonged residual polarization and that it has a fast reversible speed (reversible within a few ns).

In addition, unlike EEPROM and flash memory which require a high voltage (about 10–12 Volts) in writing and reading data, a ferroelectric memory has a low reversion voltage (in the range of about 3–5 Volts). Hence, the ferroelectric memory can be operated by a low voltage power source.

FIG. 1 illustrates a ferroelectric storage device having a ferroelectric memory. This memory has a cell structure consisting of 2 transistors and 2 capacitors. (Such structure will be hereinafter referred to as 2Tr-2C cell structure). As shown in FIG. 1, the ferroelectric storage device includes: selection transistors Q00–Q11; ferroelectric capacitors C00–C11 for storing information; word lines WL0 and WL1 connected to the respective gates of the transistors Q00–Q11; bit lines BL0 and BL1; plate lines PL0 and PL1; and bit line capacitors Cbl representing parasitic capacitances of the bit lines BL0 and BL1. The selection transistor Q00, ferroelectric capacitor C00, selection transistor Q01, and ferroelectric capacitor C01 constitutes a memory cell MC0. A memory cell MC1 also has a similar structure. A memory array comprises a multiplicity of such memory cells. The storage device of FIG. 1 also includes a bit selection circuit 1 and a voltage detection means (sense amplifier, SA) for detecting a potential difference between two bit lines BL0 and BL1.

Data write and data read to such a ferroelectric memory cell as memory cell MC0 in a ferroelectric storage device are performed as follows. The same operation will be performed to other ferroelectric memory cells.

In a data write operation, the word line WL0 is raised to a high potential (HIGH) to turn on the selection transistors Q00 and Q01. At the same time the bit line BL0 is raised to HIGH, and the bit line BL1 to a low potential (LOW) by the bit selection circuit 1. Under this condition, the plate line PL0 is first pulled to LOW and then to HIGH and back to LOW again.

Through a sequential change in potential LOW-HIGH-LOW of the plate line PL0, the ferroelectric capacitor C00 coupled with the bit line BL0 is positively polarized, while the ferroelectric capacitor C01 coupled with the bit line BL1 is negatively polarized. This condition of the capacitors represents data "1". To write data "0", opposite potentials are given to the bit lines BL0 and BL1.

In a read operation, the plate line PL0 is initially set to LOW, and the bit lines BL0 and BL1 are set to LOW by the bit selection circuit 1 to precharge or bring the bit lines to 0 Volt. The bit lines BL0 and BL1 are then floated by a signal from the bit selection circuit 1. The word line WL0 is set to HIGH to turn ON the selection transistors Q00 and Q01. Under this condition, the ferroelectric capacitor C00 and the bit line capacitor Cbl coupled with the bit line BL0 are connected in series, while the ferroelectric capacitor C01 and the bit line capacitor Cbl coupled with the bit line BL1 are connected in series.

Next, the plate line PL0 is pulled HIGH, so that the bit lines BL0 and BL1 acquire respective potentials determined by the electrostatic capacitances of the ferroelectric capacitors C00, C01 and the bit line capacitor Cbl. Then the polarization of the ferroelectric capacitor C00 coupled with the bit line BL0 is reversed if the data stored in the memory is "1", thereby generating a relatively high potential on the bit line BL0. On the other hand, the polarization of the ferroelectric capacitor C01 coupled with the bit line BL1 will not be reversed, yielding a relatively low potential on the bit line BL1.

The potential difference between the two bit lines BL0 and BL1 is detected by the sense amplifier SA, thereby distinguishing between "0" and "1" as follows:

Read data is recognized as "1" if the potential difference (BL0−BL1)>0.

Read data is recognized as "0" if the potential difference (BL0−BL1)<0.

Since data read from a memory that utilizes ferroelectric capacitors destroys the data stored in the memory, each of the bit lines BL0 and BL1 is set to HIGH or LOW, depending on the data stored, to restore the data in the memory. For example, the bit lines BL0 and BL1 are set to HIGH and LOW, respectively, when the data is "1".

So far 2Tr-2C cell structure of a ferroelectric storage device has been discussed. A ferroelectric storage device utilizing one transistor and one capacitor (referred to as 1Tr-1C structure) is also known. Such 1Tr-1C cell structure ferroelectric storage device is provided with a reference voltage generation means for providing a reference voltage to detect the difference in voltage generated on two bit lines at the time of data read. Data read operation for the 1Tr-1C cell structure device is essentially the same as for 2Tr-2C cell structure device.

Since in the ferroelectric storage device that uses a memory array of ferroelectric capacitors the content of a memory cell is determined by the potential difference between two bit lines, it is necessary that a voltage margin is secured for data read.

Conventionally, tests are performed on a ferroelectric storage device during manufacturing and a test period by screening each memory cell before and/or after it is packaged. In the tests a memory is determined to be defective or not by checking if data "0" and "1" can be correctly written to and read from the memory. However, such conventional tests cannot assess operational margin of the storage device that has passed the tests, so that the test cannot verify if the memory has a desired operational margin as designed or not.

SUMMARY OF THE INVENTION

Therefore, it is an object of the invention to provide a reliable ferroelectric storage device having an array of ferroelectric memory cells, by measuring bit line voltages that arises from the electric charges remaining in the ferroelectric memory cells, thereby quantitatively assessing deviations in characteristics and degree of defect/degradation of the ferroelectric capacitors in the cells.

In accordance with one aspect of the invention, there is provided a ferroelectric storage device having 2Tr-2C cell structure, comprising:

memory cells each including
        a first ferroelectric capacitor C0 connected in series with a first selection transistor Q0 which is selected by a word line WL; and
        a second ferroelectric capacitor C1 connected in series with a second selection transistor Q1 which is selected by the word line, the first and second ferroelectric capacitors having opposite polarization;
    a first bit line BL0 connected to one end of the series connection of the first ferroelectric capacitor C0 and the first selection transistor Q0 and having a bit line capacitor Cbl;
    a second bit line BL1 connected to one end of the series connection of the second ferroelectric capacitor C1 and the second selection transistor Q1, and having a bit line capacitor Cbl;
    a plate line PL connected to the other end of the series connection of the first ferroelectric capacitor C0 and the first selection transistor Q0 and to the other end of the series connection of the second ferroelectric capacitor C1 and the second selection transistor Q1, the plate line adapted to provide a predetermined voltage;
    a voltage detection means SA connected between the first bit line and the second bit line;
    an external reference voltage input terminal Tvref for receiving an external reference voltage Vref-ext;
    a first control switch means Q10 provided between the external reference voltage input terminal and the first bit line, and switchable between ON and OFF by a first test signal TEST0; and
    a second control switch means Q11 provided between the external reference voltage input terminal and the second bit line, and switchable between ON and OFF by a second test signal TEST1.

In this arrangement, only one of the first and the second control switch means can be selectively turned ON by the first or the second test signal.

In this screening test of a ferroelectric storage device having 2Tr-2C cell structure, only one of the test switches Q10 or Q11 is turned ON to supply a regulated reference voltage Vref to one end of the voltage detection means (sense amplifier) SA. Repetition of the test for different reference voltages Vref provides quantitative determination of the characteristics of the ferroelectric capacitor C0 (or C1) through measurement of the bit line voltage input to the other input end of the voltage detection means. The measurement provides assessment of deviations in characteristics and degrees of defect/degradation of the ferroelectric capacitors, thereby enabling improvement of the reliability of the ferroelectric storage device.

In another aspect of the invention, there is provided a ferroelectric storage device having 1Tr-1C cell structure, comprising:

memory cells each including a ferroelectric capacitor C0 connected in series with a selection transistor Q0 which is selected by a word line WL;
    a bit line BL connected with one end of the series connection of the ferroelectric capacitor and the selection transistor, and having a bit capacitor Cbl;
    a plate line PL connected with the other end of the series connection of the ferroelectric capacitor and the selection transistor, and adapted to provide a predetermined voltage;
    a reference voltage generation circuit 2 for generating a reference voltage Vref;
    an external reference voltage input terminal Tvref for receiving an external reference voltage Vref-ext;
    a voltage detection means SA having one end connected to the bit line;
    first control switch means Q12 connected between the other end of the voltage detection means SA and the external reference voltage input terminal, and adapted to switch between ON and OFF in response to a test signal TEST; and
    second control switch means Q13 connected between the other end of the voltage detection means SA and the reference voltage generation circuit, and adapted to be switchable between OFF and ON in response to a test signal.

Only one of the first and second control switch means can be selectively turned ON by the test signal.

In this arrangement, as the first control switch means Q12 provided between the external terminal Tvref and the bit line BL is turned on, an external regulated reference voltage Vref is supplied to one end of the voltage detection means SA in the screening test of 1Tr-1C cell structure ferroelectric storage device. The bit line voltage supplied to the other end of the voltage detection means SA, i.e. characteristic voltage of the ferroelectric capacitor C0 may be quantitatively determined by regulating the external reference voltage Vref.

Thus, deviations in characteristics and degrees of defect/degradation of the ferroelectric capacitors can be precisely evaluated, thereby enabling increasing reliability of the ferroelectric storage devices. The reference voltage of an external reference voltage generation circuit 2 can be set to a proper level by regulating the output voltage of the reference voltage generation circuit 2 based on the quantitatively measured characteristics of a ferroelectric capacitor C0.

In accordance with a further aspect of the invention, there is provided a ferroelectric storage device having 1Tr-1C cell structure, comprising:

memory cells each including a ferroelectric capacitor C0 connected in series with a selection transistor Q0 which is selected by a word line WL;
    a bit line BL connected to one end of the series connection of the ferroelectric capacitor and the selection transistor, and having a bit line capacitor Cbl;
    a plate line PL connected to the other end of the series connection of the ferroelectric capacitor and the selection transistor, and adapted to provide a predetermined voltage;
    a reference voltage generation circuit 2' for generating a reference voltage Vref;
    voltage detection means SA connected between the bit line and the reference voltage generation circuit, wherein the reference voltage generation circuit 2' includes
        memory means 3 storing a multiplicity of voltage data in digital form;
        a digital-analog converter 4 for converting the digital voltage data received from the memory means into an analog signal and outputting the analog signal as the reference voltage; and
        a controller 5 for instructing the memory means of voltage data to be output therefrom.

The memory means 3 may have ferroelectric memory cells of 2Tr-2C structure.

All the memory cells of the ferroelectric storage device 11 may be categorized into a multiplicity of memory cell regions 11-1 through 11-n such that each region is provided with a corresponding memory means 3-1 through 3-n and a corresponding digital-analog converter 4-1 through 4-n.

In this arrangement, in the screening test of the ferroelectric storage device having 1Tr-1C cell structure, a regulated reference voltage Vref based on the multiple voltage data stored in the ferroelectric memory means 3 is supplied from the reference voltage generation circuit 2 to one end of the voltage detection means (sense amplifier) SA. Thus, by repeating the test for different regulated reference voltages Vref supplied by the reference voltage generation circuit 2, quantitative assessment of characteristics of the ferroelectric capacitor C0 can be made through the measurement of the bit line voltage input to the other end of the voltage detection means SA.

In this manner, precise deviations in characteristics and degree of defect/degradation of ferroelectric capacitors can be obtained, which provide necessary information to improve the reliability of the ferroelectric storage device. It is possible to set an adequate reference voltage for the ferroelectric storage device by regulating the output voltage of the reference voltage generation circuit 2 based on the characteristics of a ferroelectric capacitor C0.

It is noted that the memory means 3 has a larger margin for defect/degradation as compared with ferroelectric storage memory having 1Tr-1C cell structure, since memory means 3 has 2Tr-2C structure memory cells. Accordingly, the memory means 3 has a higher reliability as a storage device.

Memory cells may be classified into different memory cell groups 11-1 through 11-n in accordance with the degree of deviations in characteristics as determined by screening tests, and an appropriate reference voltage Vref may be given to the sense amplifier SA for each group.

DETAILED DESCRIPTION OF THE PREFERRED EMBODIMENT

The inventive ferroelectric storage device will now be described in detail by way of example with reference to the accompanying drawings.

Figure 2:
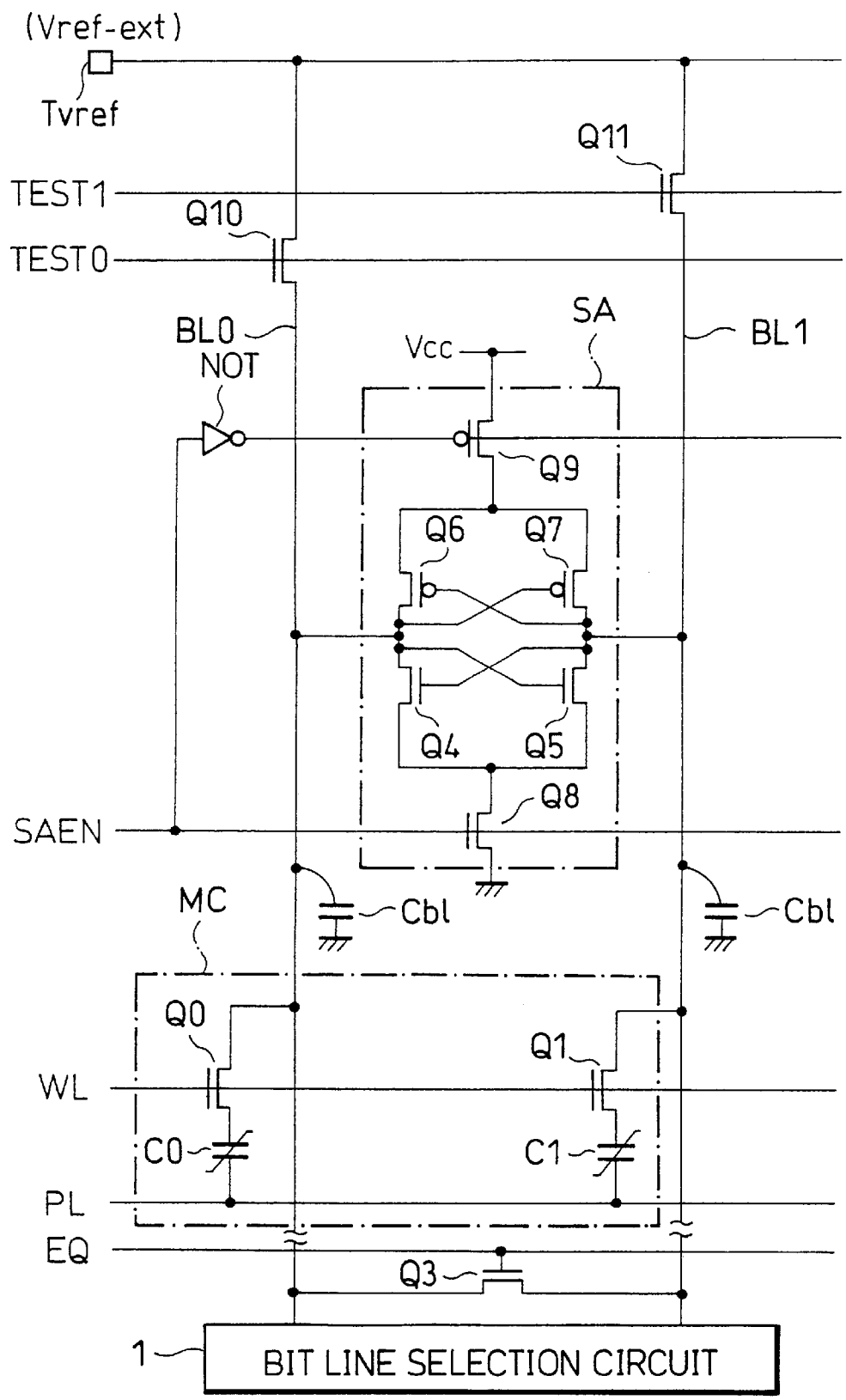
FIG. 2 shows a circuit diagram of a first ferroelectric storage device having 2Tr-2C cell structure according to the invention.
Figure 3:
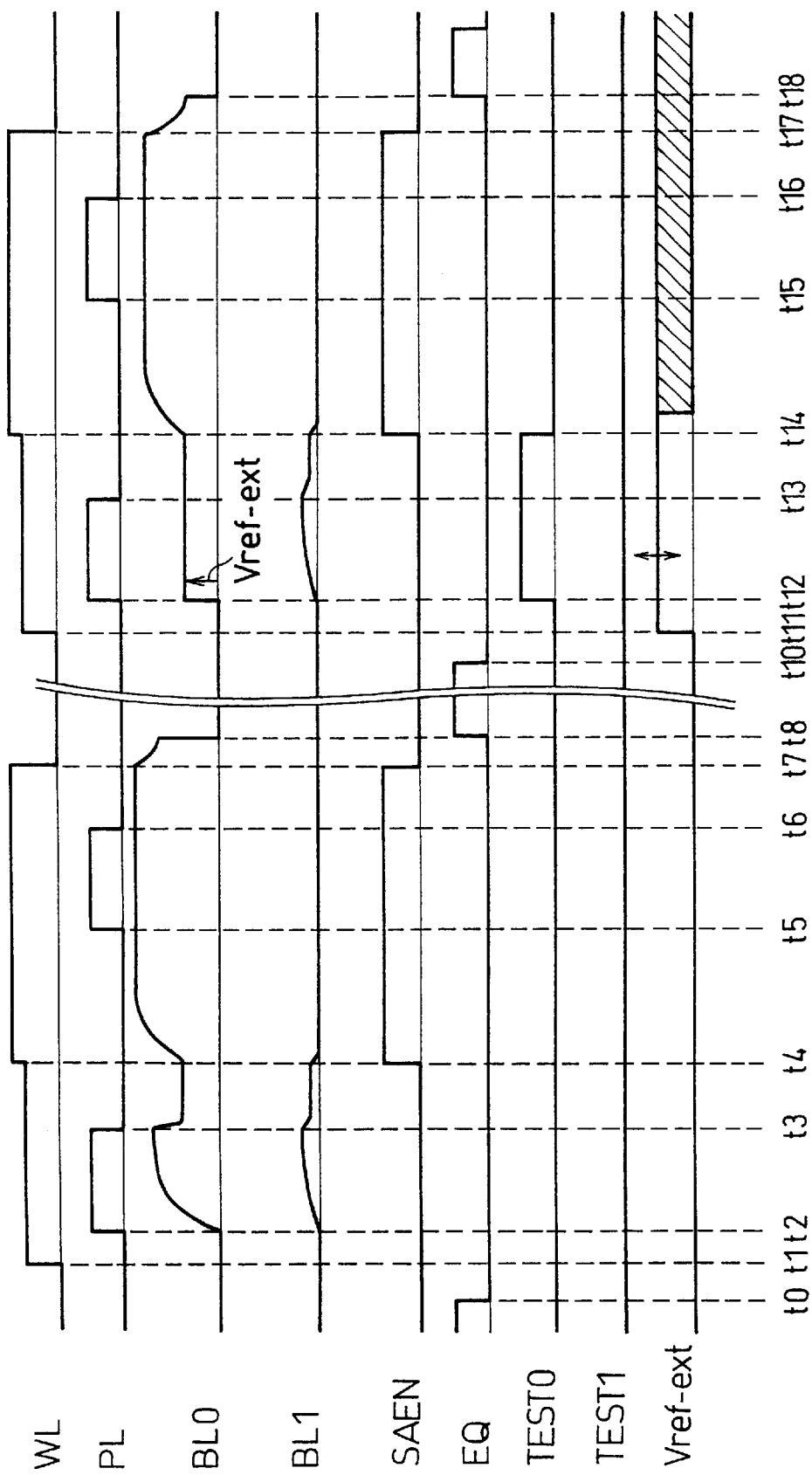
FIG. 3 is a timing chart of the ferroelectric storage device of FIG. 2, illustrating the operation thereof.

Referring now to FIG. 2, there is shown a first embodiment of a ferroelectric storage device of the invention having 2Tr-2C cell structure. FIG. 3 shows a timing chart of the operation of the ferroelectric storage device.

Figure 1:
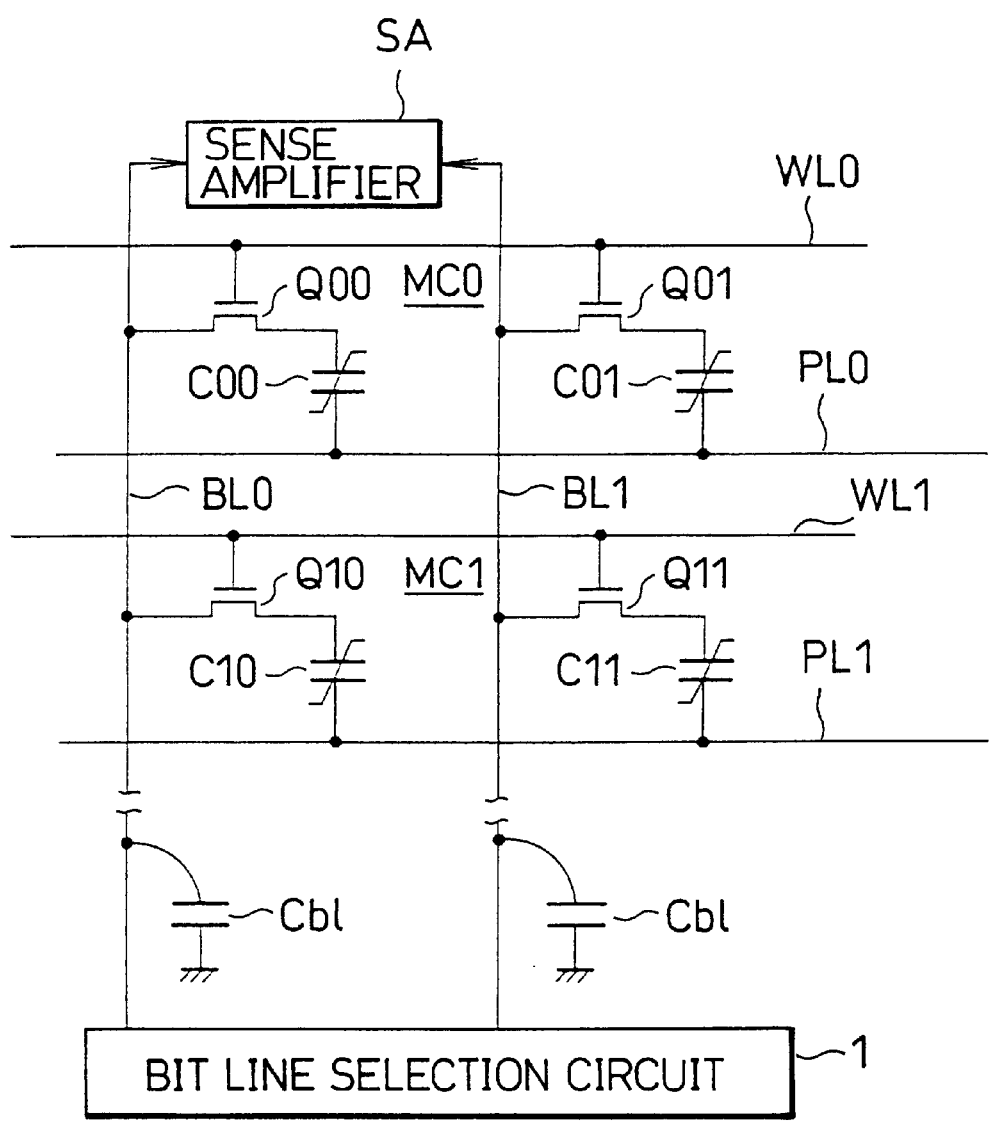
FIG. 1 shows a circuit diagram of a conventional ferroelectric storage device having 2Tr-2C cell structure.

Basic structure of the ferroelectric storage device shown in FIG. 2 is the same as that of a conventional storage device shown in FIG. 1, which includes selection transistors Q0 and Q1, ferroelectric capacitors C0 and C1 for storing information, a word line WL connected with the gates of the selection transistors Q0 and Q1, bit lines BL0 and BL1, a plate line PL, and bit line capacitors Cbl representing parasitic capacitors associated with the bit lines BL0 and BL1. The selection transistor Q0, ferroelectric capacitor C0, selection transistor Q1, and ferroelectric capacitor C1 together form a memory cell MC. A multiplicity of such memory cells constitute a memory array.

Connected between the two bit lines BL0 and BL1 is an equalization transistor Q3, which is driven by a signal on an equalization line EQ.

Transistors Q8 and Q9 are connected to a sense amplifier enable line SAEN for driving these transistors. A sense amplifier SA consists of the transistors Q8 and Q9 and transistors Q4–Q7 for comparing and holding the potential of the bit lines BL0 and BL1.

The ferroelectric storage device has a terminal Tvref for inputting an externally supplied reference voltage, and test signal lines TEST0 and TEST1. The test signal line TEST0 may drive a test transistor Q10 connected between the bit line BL0 and the external reference voltage input terminal Tvref, and the test signal line TEST1 drives a test transistor Q11 connected between the bit line BL1 and the external reference voltage input terminal Tvref.

A circuit 1 is a bit line selection circuit for setting a bit line to a predetermined potential. An element NOT is an inversion circuit. In FIG. 2, p-type MOS transistors are marked with an open circle. Transistors not marked with an open circle are n-type MOS transistors. This is also the case throughout other figures.

In a ferroelectric storage device thus constructed, data read and data write operations are carried out as follows.

Data write is performed by bringing the word line WL to HIGH, selection transistors Q0 and Q1 turned ON, and the bit lines BL0 to HIGH while bringing the bit line BL1 to LOW by the bit line selection circuit 1, in the same manner as described in connection with a conventional storage device shown in FIG. 1. Under this condition, the potential of the plate line PL is first reduced to LOW, and second raised to HIGH, and then to LOW.

Through the sequential change LOW-HIGH-LOW in potential of the plate line PL, the ferroelectric capacitor C0 connected with the bit line BL0 is positively polarized, while the ferroelectric capacitor C1 connected with the bit line BL1 is negatively polarized. This condition represents data "1". To write data "0", voltages given to the bit lines BL0 and BL1 are interchanged.

Next, data read operation will be described with reference to a timing chart of the storage device as shown in FIG. 3. This is a timing chart for a data read operation when data "1" is stored.

By time t0 equalization line EQ is raised to HIGH to thereby turning ON the transistor Q3. At the same time the bit lines BL0 and BL1 are precharged to have 0 Volt by the bit line selection circuit 1. Subsequently, a signal from the bit selection circuit 1 renders the bit lines BL0 and BL1 to float. The selection transistors Q0 and Q1 are then turned ON at time t1 by bringing the word line WL to HIGH. Under this condition, the ferroelectric capacitor C0 and the bit line capacitor Cbl of the bit line BL0 are connected in series, and so are the ferroelectric capacitor C1 and the bit line capacitor Cbl of the bit line BL1.

Next, over a period t2 and t3, the plate line PL is brought to HIGH, which causes the bit lines BL0 and BL1 to be charged with a potential as determined by the capacitances of the ferroelectric capacitors C0 and C1 and the bit line capacitor Cbl. In this case, since data "1" is stored, the polarization of the ferroelectric capacitor C0 connected with the bit line BL0 is inverted, which in turn generates a relatively high potential on the bit line BL0. On the other hand, polarization of the ferroelectric capacitor C1 connected with the bit line BL1 remains unchanged, generating an extremely low potential on the bit line BL1.

Next, when the sense amplifier enable line SAEN goes to HIGH at time t4, the transistors Q8 and Q9 are turned ON to enable the sense amplifier SA. Under this condition, the bit line BL0 has a higher potential than that of the bit line BL1, so that the transistors Q5 and Q6 are turned ON and the transistors Q4 and Q7 are turned OFF. This makes the bit line BL0 to have the power supply voltage Vcc, and the bit line BL1 grounded, thereby recognizing the data "1".

In a period of t5–t6, the potential of the plate line PL is set to HIGH, which causes the bit lines BL0 and BL1 to be impressed by potentials of HIGH and LOW, respectively (that is, data "1" is rewritten). It is noted that in this instance, in order to supplement the potential drop in the selection transistors Q0 and Q1, the word line WL is raised to a higher potential than HIGH so as to provide a sufficiently high potential to the ferroelectric capacitors C0 and C1.

At time t7, the word line WL and the sense amplifier enable line SAEN are lowered to LOW. At time t8 the equalization line EQ goes HIGH, and the bit lines BL0 and BL1 goes to 0 Volt, thereby restoring the initial memory. Ordinary data write and data read of a given data "0" and "1" to each memory cell are carried out in this manner.

Data read operation during a test can be done as follows. In this test external reference voltage Vref-ext regulated to an arbitrary voltage level is fed to one of the bit line BL0 and BL1 to see if the ferroelectric capacitors C1 or C0 connected to the other bit line is functioning and evaluate their operational margin.

The transistor Q3 is turned ON by an HIGH signal on the equalization line EQ by time t10 as shown in FIG. 3. At the same time the bit lines BL0 and BL1 are both equally precharged to 0 Volt by the bit line selection circuit 1, after which the bit lines BL0 and BL1 are floated by a signal from the bit line selection circuit 1. Subsequently, the word line WL is supplied with HIGH potential at time t11 to turn ON the selction transistors Q0 and Q1. It is noted that at this moment (or prior to or after this moment), a properly regulated external reference voltage Vref-ext is supplied to the external reference voltage input terminal Tvref.

Next, the test signal line TEST0 is pulled HIGH over a period from t12 to t14, and the plate line PL is pulled HIGH only for a period from t12 to t13. This results in a potential on the bit lines BL0 and BL1 in accord with the polarization of the ferroelectric capacitors C0 and C1. However, since the transistor Q10 is turned ON by the test signal line TESTO, the bit line BL0 is supplied with the external reference voltage Vref-ext. On the other hand, the potential of the bit line BL1 has a low potential in accord with data "1" stored in the memory cell MC.

At time t14, the test signal line TEST0 is pulled down to LOW and the sense amplifier enable line SAEN pulled HIGH, and the word line WL is set to a level higher than HIGH. This turns ON the transistors Q8 and Q9, making the sense amplifier SA operative. The stored data "1" may be obtained or read by comparing the external reference voltage Vref-ext on the bit line BL0 with the low potential on the bit line BL1. In this situation, since the transistors Q5 and Q6 are turned ON and the transistors Q4 and Q7 are turned OFF, the bit line BL0 is brought to the power supply voltage Vcc and the bit line BL1 to the ground potential.

By changing the potential of the plate line PL from HIGH to LOW during a period from t15 to t17, data "1" is rewritten to the ferroelectric capacitors C0 and C1 in accordance with the potentials of the bit lines BL0 and BL1. At time t17, the word line WL and the sense amplifier enable line SAEN are pulled LOW, and returns to their initial states at time t18, completing the data read operation.

For each of the data "1" and "0" stored in the memory cell MC, test is performed by changing the external reference voltage Vref-ext supplied through the external reference voltage input terminal Tvref, i.e. the potential on the bit line BL0. The characteristics of the ferroelectric capacitor C1 connected with the other bit line BL1 can be measured in this way. It would be apparent that the same measurement can be done by switching the roles of the bit lines. Thus, deviations in characteristics and the degree of defect/degradation of the ferroelectric capacitors C0 and C1 can be accurately assessed to improve the reliability of the ferroelectric storage device.

Figure 4:
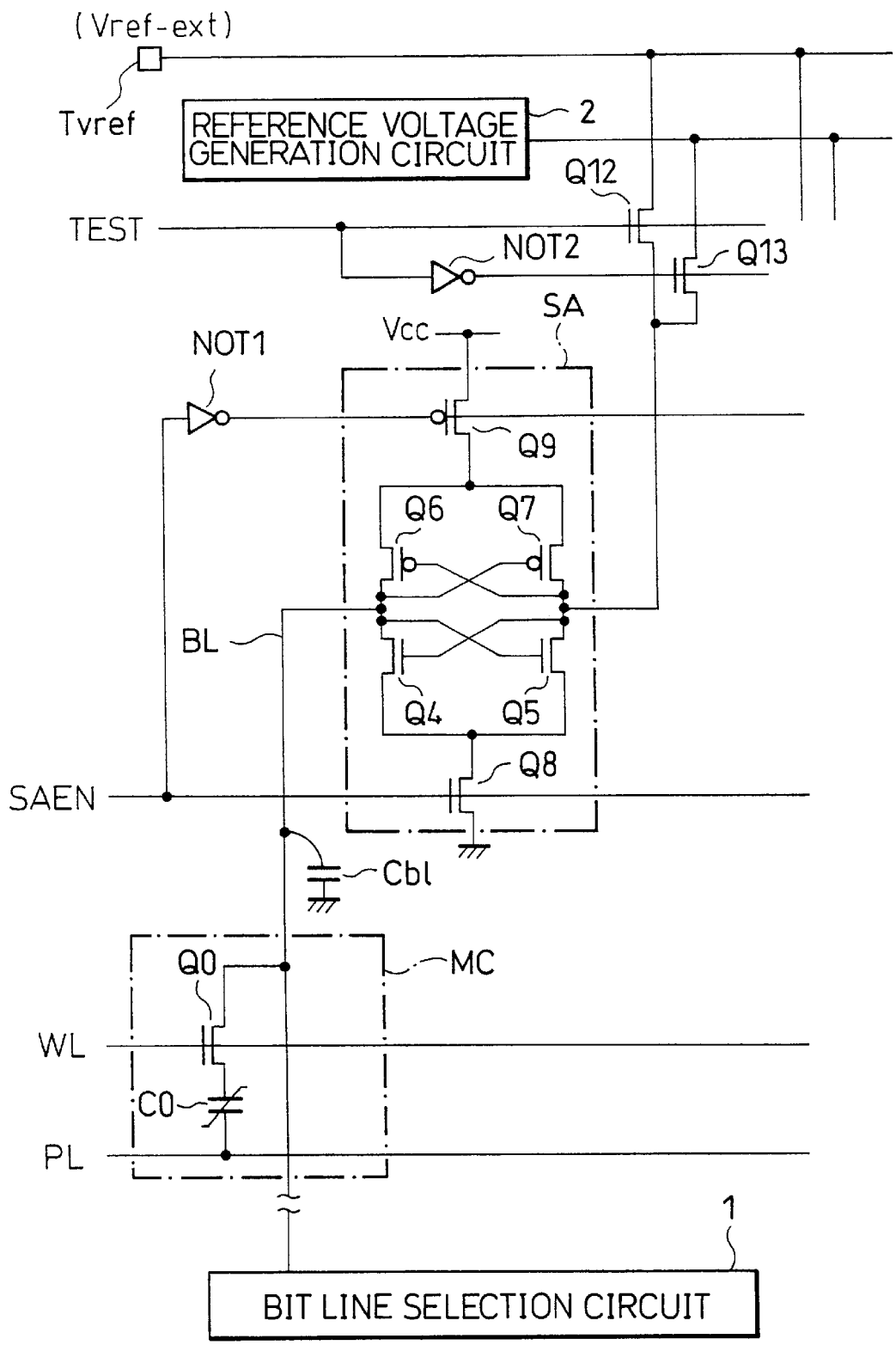
FIG. 4 shows a circuit diagram of a second ferroelectric storage device having 1Tr-1C cell structure according to the invention.
Figure 5:
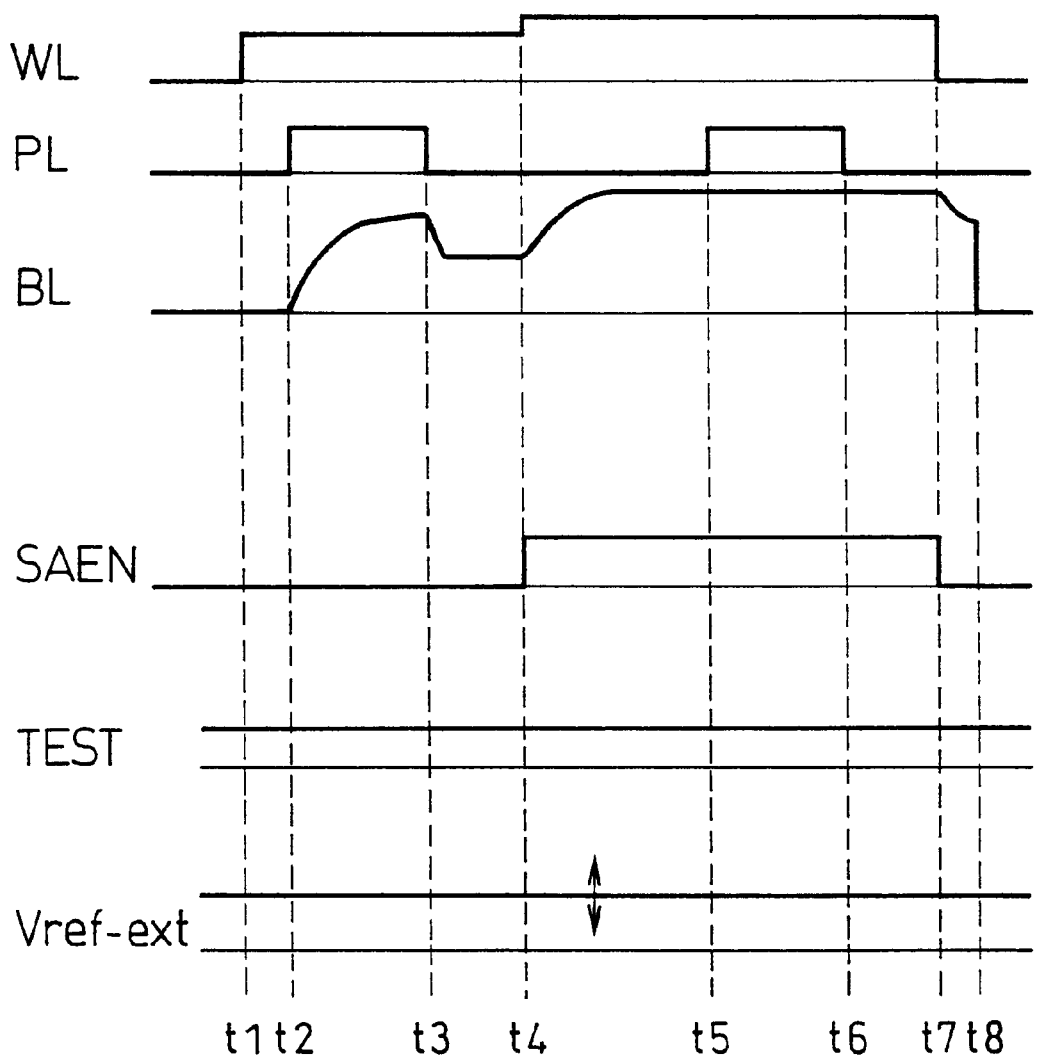
FIG. 5 is a timing chart of the ferroelectric storage device of FIG. 4, illustrating the operation thereof.

Referring to FIG. 4, there is shown a structure of a ferroelectric storage device having 1Tr-1C cell structure, in which like reference numerals indicate like elements in FIG. 2. FIG. 5 is a timing chart for this storage device.

A reference voltage generation circuit 2 for generating a reference voltage Vref, which is set to a specific level as shown in FIG. 4. The reference voltage is supplied to a sense amplifier SA through a transistor Q13 which is normally turned ON. An external reference voltage Vref-ext is supplied to an external reference voltage input terminal Tvref, which voltage is supplied to the sense amplifier SA as a reference voltage through a transistor Q12 which is turned ON by a test signal TEST. The transistor Q13 is turned OFF by the test signal TEST. Elements NOT1 and NOT2 are inverter circuits.

Data write to a memory cell MC shown in FIG. 4 is done in a manner similar to that of a conventional memory cell.

In ordinary data read from the memory cell MC, the transistor Q13 is turned ON and the reference voltage Vref from the reference voltage generation circuit 2 is input to the sense amplifier SA. During the test of a memory cell the transistor Q12 is turned ON, and the external reference voltage Vref-ext is supplied to the sense amplifier SA through the external reference input terminal Tvref. The external reference voltage Vref-ext may be regulated arbitrarily to a preferred level in accordance with the test performed.

Operation of the circuit shown in FIG. 4 is the same in both normal operation and the test, except that the reference voltage supplied to the sense amplifier differs in that the reference voltage Vref generated by the reference voltage generation circuit 2 is supplied in the former case but the external reference voltage Vref-ext is supplied in the latter case. Hence, only the latter case will be described below.

Referring now to FIG. 5, it is shown that the bit line BL has been precharged to 0 Volt prior to time t1. At time t1, the word line WL is set to HIGH to turn ON the selection transistor Q0. The plate line PL is then pulled HIGH at time t2. This condition is continued until time t3. As the plate line PL becomes HIGH, a voltage is generated on the bit line BL as determined by the capacitances of the ferroelectric capacitor C0 and the bit line capacitor Cbl. Since the stored data is now assumed to be "1", the polarization of the ferroelectric capacitor C0 is inverted, generating a relatively high potential on the bit line BL.

Next, the sense amplifier enable line SAEN is pulled HIGH at time t4, turning ON the transistors Q8 and Q9 and enabling the sense amplifier SA. Since the potential of the bit line BL is higher than that of the external reference voltage Vref-ext under this condition, the transistors Q5 and Q6 are turned ON and the transistors Q4 and Q7 turned OFF. This will make the potential on the bit line BL to be Vcc, the power supply voltage, thereby allowing identification of the stored data to be "1". It is noted that at this moment the reference voltage supplied to the sense amplifier SA is lower than the external reference voltage Vref-ext because the transistors Q5 and Q8 are turned ON.

By bringing the plate line PL to HIGH and then to LOW during a period from t5 to t7, the HIGH potential (data "1") on the bit line BL is applied to the memory cell MC to rewrite the data. In this data write, in order to compensate a potential drop in the selection transistor Q0, the potential on the word line WL is raised sufficiently high to supply the ferroelectric capacitor C0 with adequate potential.

Then at time t7, the word line WL and the sense amplifier enable line SAEN are pulled LOW, and at time t8 the bit line BL is lowered to 0 Volt, restoring its initial memory condition.

The above data read procedure is concerned with data "1". A similar data read procedure applies to data "0".

In this test, the procedure is repeated for each of the memory cells in the ferroelectric storage device by regulating the external reference voltage Vref-ext in accord with the data "1" or "0", to thereby quantitatively assessing characteristics of each memory cell. Deviations in characteristics and degrees of defect/degradation of the ferroelectric capacitors can be thus accurately assessed by the test to improve the reliability of the ferroelectric storage device.

Based on the test, defective/degraded memory cells are removed from use. However, memory cells that has passed the test are not uniform in operational characteristics.

Figure 6:
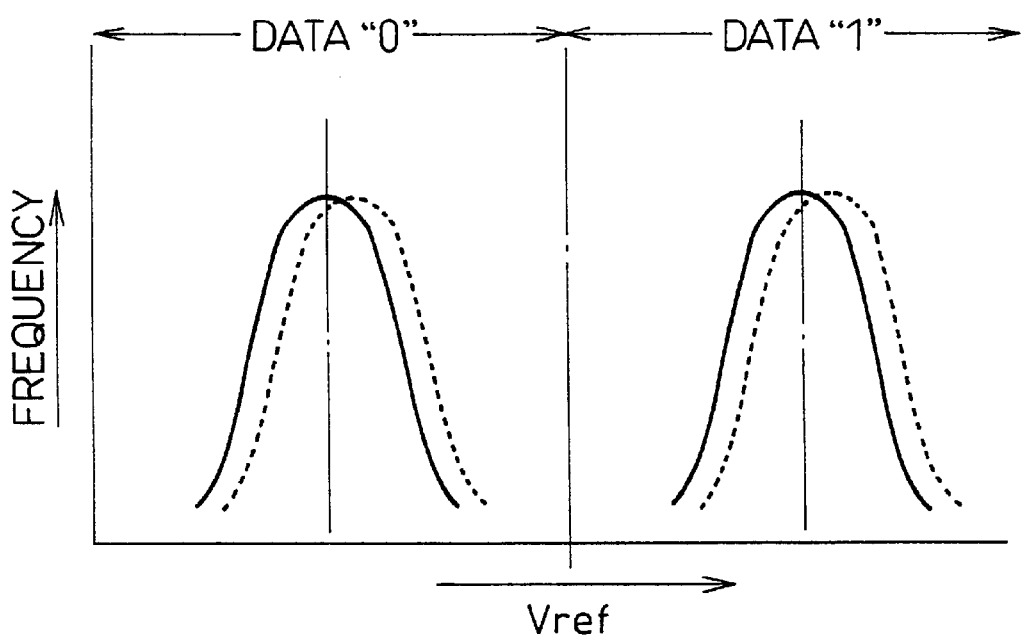
FIG. 6 is a histogram, showing the number of responding memory cells as a function of applied reference voltage.

FIG. 6 is a histogram showing fluctuations in operational characteristics of memory cells in a ferroelectric storage device in terms of the number of healthy memory cells that exhibit a proper response to a given reference voltage Vref. It is seen in FIG. 6 that many of the memory cells in the ferroelectric storage device exhibit response deviations, which differ for data "1" and "0". In addition, the deviations depend on materials and manufacturing conditions of the cells, as shown by a solid curve and a broken curve in FIG. 6.

The most optimum reference voltage Vref of the sense amplifier SA may be determined based on the measured distribution of deviations. For example, the optimum reference voltage Vref may be set to the mean of the peak voltages (i.e. voltage at which the frequency becomes maximum) for the data "0" and for data "1". Alternatively, the optimum voltage may be determined as the mean of the voltages of cells having the least operational margins for data "0" and "1".

The output voltage of the reference voltage generation circuit 2 is set to this optimum reference voltage Vref. Thus, values of the bits stored in the memory can be determined.

Figure 7:
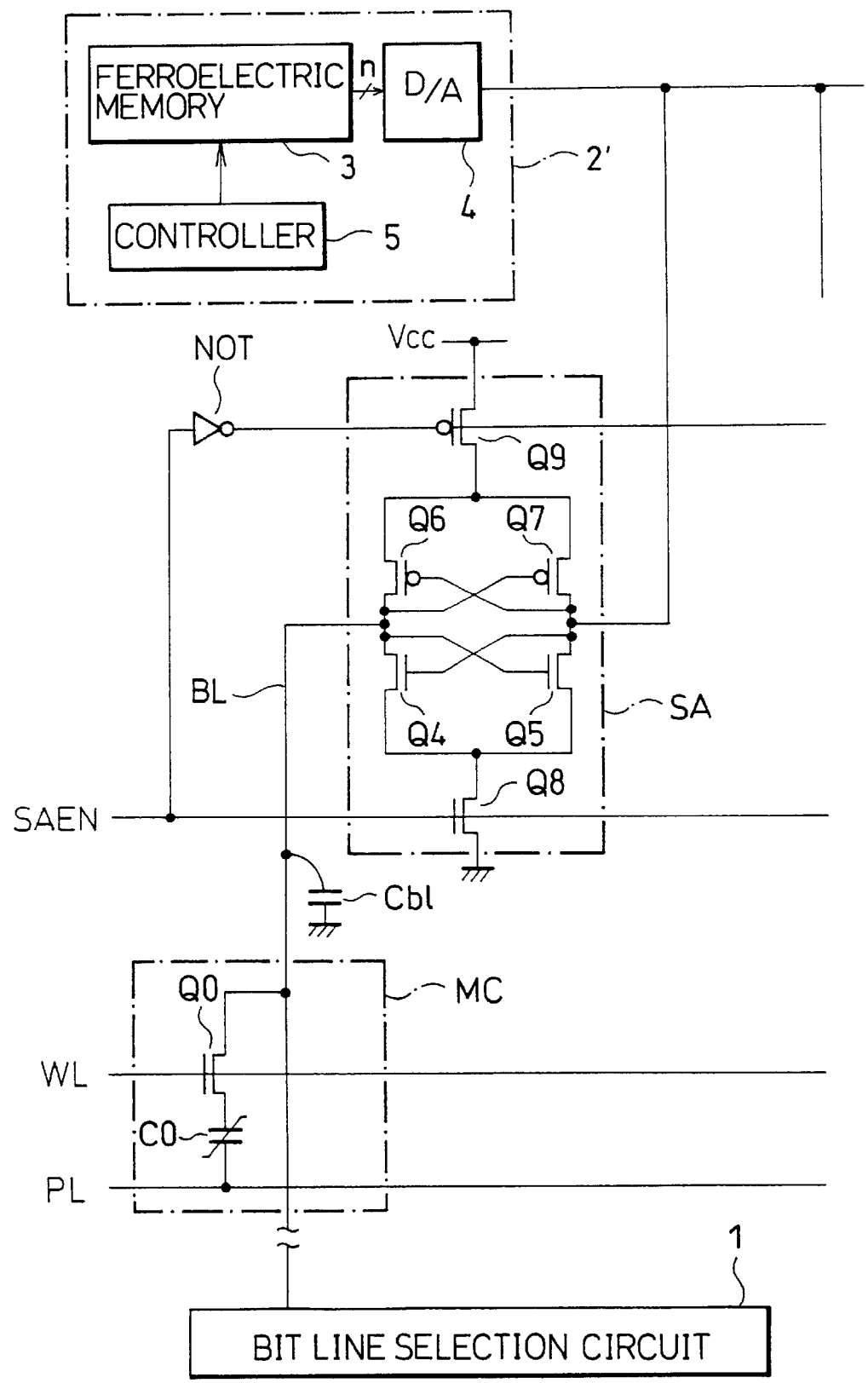
FIG. 7 shows a circuit diagram of a third ferroelectric storage device having 1Tr-1C cell structure according to the invention.

FIG. 7 shows 1Tr-1C cell structure of a third ferroelectric storage device according to the invention.

This storage device has no external reference voltage input terminal Tvref, transistors Q12 and Q13, or a reference voltage generation circuit 2 as shown in FIG. 4, but instead has a reference voltage generation circuit 2', as shown in FIG. 7, which circuit is capable of generating different reference voltages Vref as needed in testing a ferroelectric storage device. Other features of the device are the same as the preceding device shown in FIG. 4.

The reference voltage generation circuit 2' consists of a ferroelectric memory 3, a digital-analog converter 4, and a controller 5. The ferroelectric memory 3 can be any nonvolatile memory having 2Tr-2C cell structure (such as one shown in FIG. 1) for storing digital data for use in setting up different voltages in the test of the ferroelectric storage device. The digital-analog converter 4 converts a digital data indicative of a voltage selectively output from the ferroelectric memory 3 into an analog data to be provided to the sense amplifier SA as the reference voltage Vref. The controller 5 instructs the ferroelectric memory 3 of voltage data used in the test of the ferroelectric storage device and in normal operation as well.

In the embodiment shown in FIG. 7, the reference voltage generation circuit 2' is used for quantitative measurement of the characteristics of each memory cell in the ferroelectric storage device and for accurate assessment of the deviations and degrees of defect/degradation of the ferroelectric capacitors, in the same manner as in the example shown in FIG. 4, to thereby improve the reliability of the ferroelectric storage device.

Based on such assessment of deviations measured, an optimum reference voltage Vref of the sense amplifier SA is determined. The optimum reference voltage Vref is used as the output voltage of the reference voltage generation circuit 2' built in the ferroelectric storage device. Thus, assessment of stored data can be made using a practical reference voltage.

It is understood that the ferroelectric memory 3 is used not only in the above described test but also in normal operation. Since the memory 3 is a non-volatile memory having 2Tr-2C cell structure, it has a greater defect/degradation margin than a corresponding non-volatile memory having 1Tr-1C cell structure. Hence, the memory cell 3 adds extra reliability to the ferroelectric storage device.

Figure 8:
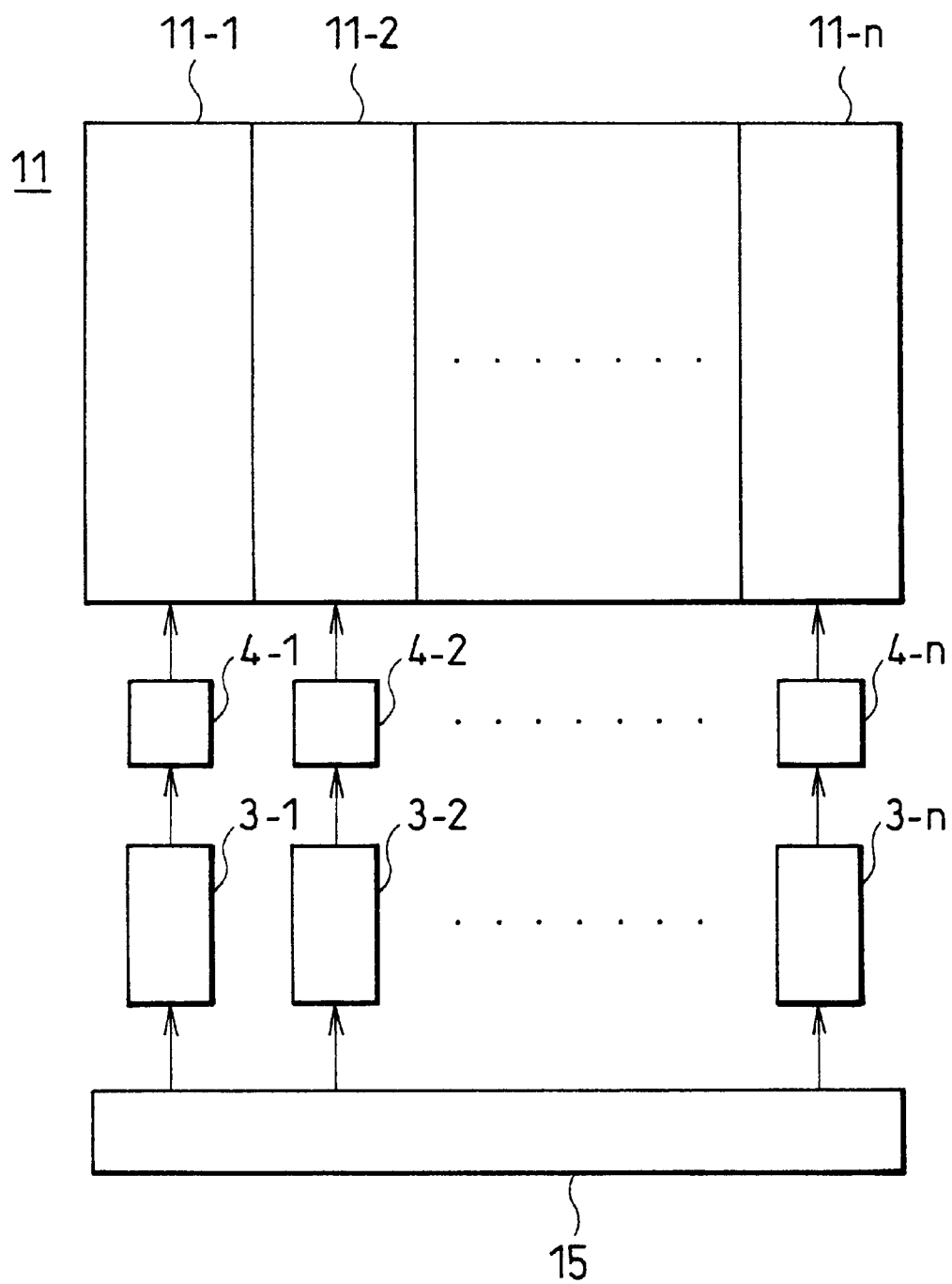
FIG. 8 shows a circuit diagram of an alternative to the third ferroelectric storage device having 1Tr-1C cell structure according to the invention.

FIG. 8 shows a third ferroelectric storage device having 1Tr-1C cell structure according to the invention. This is an alternative to the ferroelectric storage device FIG. 7. In this example, all the memory cells of the ferroelectric storage device 11 are categorized into a multiplicity of n regions 11-1 through 11-n. This storage device is provided with n ferroelectric memories 3-1 through 3-n and n digital-analog converters 4-1 through 4-n, one for each of n regions 11-1 through 11-n. Each of n groups consisting of the respective memory regions and digital-analog converters corresponds to the ferroelectric memory 3 and digital-analog converter 4 of FIG. 7, individually controlled by a common controller 15.

A multiplicity of memory cells are provided in the ferroelectric storage device 11. Characteristics of these memory cells, especially characteristics of the ferroelectric capacitors thereof, depend on their locations in the storage device, since their characteristics are affected by thermal gradient or thickness gradient of the ferroelectric layer.

Deviations in characteristics of the memory cells of each region are determined by screening tests. An optimum reference voltage for each of the regions 11-1 through 11-n is determined in accordance with the deviations obtained for the region. The optimum reference voltages Vref for the respective regions are supplied from the sense amplifier SA to the respective ferroelectric memories 3-1 through 3-n and digital-analog converters 4-1 through 4-n.

I claim:

1. A ferroelectric storage device having 2Tr-2C cell structure, comprising:
   memory cells each including:
      a first ferroelectric capacitor connected in series with a first selection transistor which is selected by a word line; and
      a second ferroelectric capacitor connected in series with a second selection transistor which is selected by said word line, said first and second ferroelectric capacitors having opposite polarization;
   a first bit line connected to one end of said series connection of said first ferroelectric capacitor and said first selection transistor and having a bit line capacitor;
   a second bit line connected to one end of said series connection of said second ferroelectric capacitor and said second selection transistor, and having a bit line capacitor;
   a plate line connected to the other end of said series connection of said first ferroelectric capacitor and said first selection transistor and to the other end of said series connection of said second ferroelectric capacitor and said second selection transistor, said plate line adapted to provide a predetermined voltage;
   a voltage detection means connected between said first bit line and second bit line;
   one external reference voltage input terminal for receiving an external reference voltage;
   first control switch means connected between said external reference voltage input terminal and said first bit line, and switchable between ON and OFF by a first test signal; and
   second control switch means connected between said external reference voltage input terminal and said second bit line, and switchable between ON and OFF by a second test signal,
   wherein only one of said first and second control switch means is selectively turned ON by said first or second test signal.

2. A ferroelectric storage device having 1Tr-1C cell structure, comprising:
   memory cells each including a ferroelectric capacitor connected in series with a selection transistor which is selected by a word line;
   a bit line connected to one end of said series connection of said ferroelectric capacitor and said selection transistor, and having a bit capacitor;
   a plate line connected to the other end of said series connection of said ferroelectric capacitor and said selection transistor, and adapted to provide a predetermined voltage;
   a reference voltage generation circuit for generating a reference voltage;
   one external reference voltage input terminal for receiving an external reference voltage;
   a voltage detection means having one end connected to said bit line;
   first control switch means connected between the other end of said voltage detection means and said external reference voltage input terminal, and adapted to switch between ON and OFF in response to a test signal; and
   second control switch means connected between the other end of said voltage detection means and said reference voltage generation circuit; and adapted to be switchable between OFF and ON in response to a test signal;
   wherein only one of said first and second control switch means is selectively turned ON by said test signal.

3. A ferroelectric storage device having 1Tr-1C cell structure, comprising:
   memory cells each including a ferroelectric capacitor connected in series with a selection transistor which is selected by a word line;
   a bit line connected to one end of said series connection of said ferroelectric capacitor and said selection transistor, and having a bit capacitor;
   a plate line connected to the other end of said series connection of said ferroelectric capacitor and said selection transistor, and adapted to provide a predetermined voltage;
   a reference voltage generation circuit for generating a reference voltage;
   voltage detection means connected between said bit line and said reference voltage generation circuit, wherein said reference voltage generation circuit includes
      memory means storing a multiplicity of voltage data in digital form;
      a digital-analog converter for converting said digital voltage data received from said memory means into an analog signal and outputting said analog signal as said reference voltage; and
      a controller for instructing the memory means of voltage data to be output therefrom.

4. The ferroelectric storage device according to claim 3, wherein said memory means has ferroelectric memory cells of 2Tr-2C structure.

5. The ferroelectric storage device according to claim 4, wherein all of said memory cells are classified into a multiplicity of memory cell regions, each region provided with a corresponding memory means and a corresponding digital-analog converter.

* * * * *